(12) United States Patent
Sakuma

(10) Patent No.: US 11,631,650 B2
(45) Date of Patent: Apr. 18, 2023

(54) SOLDER TRANSFER INTEGRATED CIRCUIT PACKAGING

(71) Applicant: International Business Machines Corporation, Armonk, NY (US)

(72) Inventor: Katsuyuki Sakuma, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 8 days.

(21) Appl. No.: 17/348,162

(22) Filed: Jun. 15, 2021

(65) Prior Publication Data

US 2022/0399298 A1   Dec. 15, 2022

(51) Int. Cl.
| | |
|---|---|
| B23K 1/00 | (2006.01) |
| H01L 23/00 | (2006.01) |
| H01L 21/50 | (2006.01) |
| B23K 1/005 | (2006.01) |
| H01L 21/60 | (2006.01) |

(52) U.S. Cl.
CPC ............ *H01L 24/14* (2013.01); *B23K 1/0056* (2013.01); *H01L 21/50* (2013.01); *H01L 24/75* (2013.01); *H01L 2021/60112* (2013.01)

(58) Field of Classification Search
CPC ......... H01L 24/14; H01L 21/50; H01L 24/75; H01L 2021/60112; B23K 1/0016; B23K 2101/36–42

See application file for complete search history.

(56) References Cited

U.S. PATENT DOCUMENTS

| | | |
|---|---|---|
| 5,323,947 A | 6/1994 | Juskey |
| 5,751,068 A | 5/1998 | McMahon |
| 5,873,511 A | 2/1999 | Shapiro |
| 6,000,603 A | 12/1999 | Koskenmaki |
| 6,095,397 A | 8/2000 | Wolf |
| 6,294,745 B1 | 9/2001 | Gruber |
| 7,838,954 B2 | 11/2010 | Buchwalter |
| 8,541,291 B2 | 9/2013 | Furman |
| 10,192,804 B2 | 1/2019 | Chen |

(Continued)

FOREIGN PATENT DOCUMENTS

| | | | | |
|---|---|---|---|---|
| CN | 101859728 A | * | 10/2010 | ........... H01L 21/268 |
| CN | 111834278 A | * | 10/2020 | ......... H01L 21/6835 |

(Continued)

OTHER PUBLICATIONS

Shan et al., "Laser direct printing of solder paste", AIP Advances 9, 125306 (2019), Published online: Dec. 11, 2019, 8 pages, <https://doi.org/10.1063/1.5132918>.

*Primary Examiner* — Kiley S Stoner

(74) *Attorney, Agent, or Firm* — Monchai Chuaychoo

(57) ABSTRACT

An approach for transferring solder to a laminate structure in IC (integrated circuit) packaging is disclosed. The approach comprises of a device and method of applying the device. The device comprises of a substrate, a laser ablation layer and solder layer. The device is made by depositing a laser ablation layer onto a glass/silicon substrate and plenty of solder powder/solder pillar is further deposited onto the laser ablation layer. The laminate packaging substrate includes pads with a pad surface finishing layer made from gold. The solder layer of the device is bonded to the laminate packaging substrate. Once bonded, using laser to irradiate the laser ablation layer, the substrate is removed from the laminate.

8 Claims, 10 Drawing Sheets

(56) References Cited

U.S. PATENT DOCUMENTS

| | | |
|---|---|---|
| 10,529,698 B2 | 1/2020 | Yu |
| 2004/0146659 A1 | 7/2004 | Bednarz |
| 2006/0011712 A1 | 1/2006 | Oggioni |
| 2009/0184407 A1* | 7/2009 | Arvin ...................... H01L 21/56 |
| | | 257/E23.18 |
| 2010/0258543 A1* | 10/2010 | Mizuno ................... H01L 24/95 |
| | | 219/121.72 |
| 2018/0333945 A1* | 11/2018 | Li ........................ H01L 21/6835 |
| 2020/0058541 A1* | 2/2020 | Konishi ............ H01L 21/76251 |
| 2020/0357950 A1* | 11/2020 | Takagi ................... H01L 33/24 |
| 2020/0366064 A1 | 11/2020 | McLaurin |
| 2022/0256698 A1* | 8/2022 | Zenou .................... H05K 3/341 |

FOREIGN PATENT DOCUMENTS

| | | | | |
|---|---|---|---|---|
| CN | 111883502 A | | 11/2020 | |
| CN | 112366168 A | * | 2/2021 | |
| CN | 114709163 A | * | 7/2022 | |
| EP | 2731126 A1 | * | 5/2014 | ............. B23K 35/02 |
| JP | H10209625 A | * | 8/1998 | |
| JP | 2002314052 A | * | 10/2002 | ......... H01L 21/6835 |
| KR | 20080020569 A | * | 3/2008 | |
| KR | 20200130076 A | * | 11/2020 | |
| KR | 20210058019 A | * | 5/2021 | |
| KR | 20210095079 A | * | 7/2021 | |
| KR | 20210133398 A | * | 11/2021 | |
| KR | 102409849 B1 | * | 6/2022 | |
| TW | I744181 B | * | 10/2021 | |
| WO | 9731395 A1 | | 8/1997 | |
| WO | WO-2012132175 A1 | * | 10/2012 | ........... B23K 1/0016 |
| WO | WO-2012142177 A2 | * | 10/2012 | ............. B29C 65/16 |
| WO | WO-2014112425 A1 | * | 7/2014 | ............... B23K 1/19 |

\* cited by examiner

*(Top view)*

*(Top view)*

SOLDER TRANSFER INTEGRATED CIRCUIT PACKAGING

BACKGROUND

The present invention relates generally integrated circuit (IC) devices, and more particularly to soldering dies in IC packaging.

IC packaging involves assembly, encapsulation or sealing semiconductor device. This may involve one die on a device or could involve multiple dies on a device. A SiP (system in packaging) has a one or more ICs enclosed in one or more chip carrier packages. The dies containing the IC maybe stacked vertically on a silicon substrate. SiP may rely on wires to connect to the package. Other types packaging (i.e., flip chip) may include solder bumps to join stacked chips together.

SUMMARY

Aspects of the present invention disclose a system and method for transferring solder to laminate substrate in IC packaging. The device may include, a substrate of high-density interconnection; a laser ablation layer disposed on the substrate; one or more solder materials disposed on the ablation layer; a laminate substrate; one or more pads disposed on the laminate substrate; a laser configured to irradiate the laser ablation layer; and one or more pad finishing layers located on the one or more pads, configured to receive the one or more solder materials.

Another embodiment of the method for applying the device to a laminate may be implemented by one or more computer processors and may include, applying a first flux; positioning solder structure over target, wherein the solder structure comprises: a substrate, a laser ablation layer, an adhesive layer, a solder layer made with solder; lowering the solder structure towards the target, wherein the target comprises: a laminate substrate, one or more pads located on the laminate substrate, one or more pad surface finishing layers located on a top surface of the one or more pads; bonding solder of the solder structure to the target; debonding the solder structure; cleaning residue of the first flux, the adhesive layer, and the laser ablation layer.

Other aspects of the present invention disclose a method for creating the system for transferring solder to laminate substrate in IC packaging may be implemented by one or more computer processors and may include, depositing a laser ablation layer onto a substrate; and depositing solder material onto the laser ablation layer.

BRIEF DESCRIPTION OF THE DRAWINGS

Preferred embodiments of the present invention will now be described, by way of example only, with reference to the following drawings, in which.

DETAILED DESCRIPTION

Figure 1:
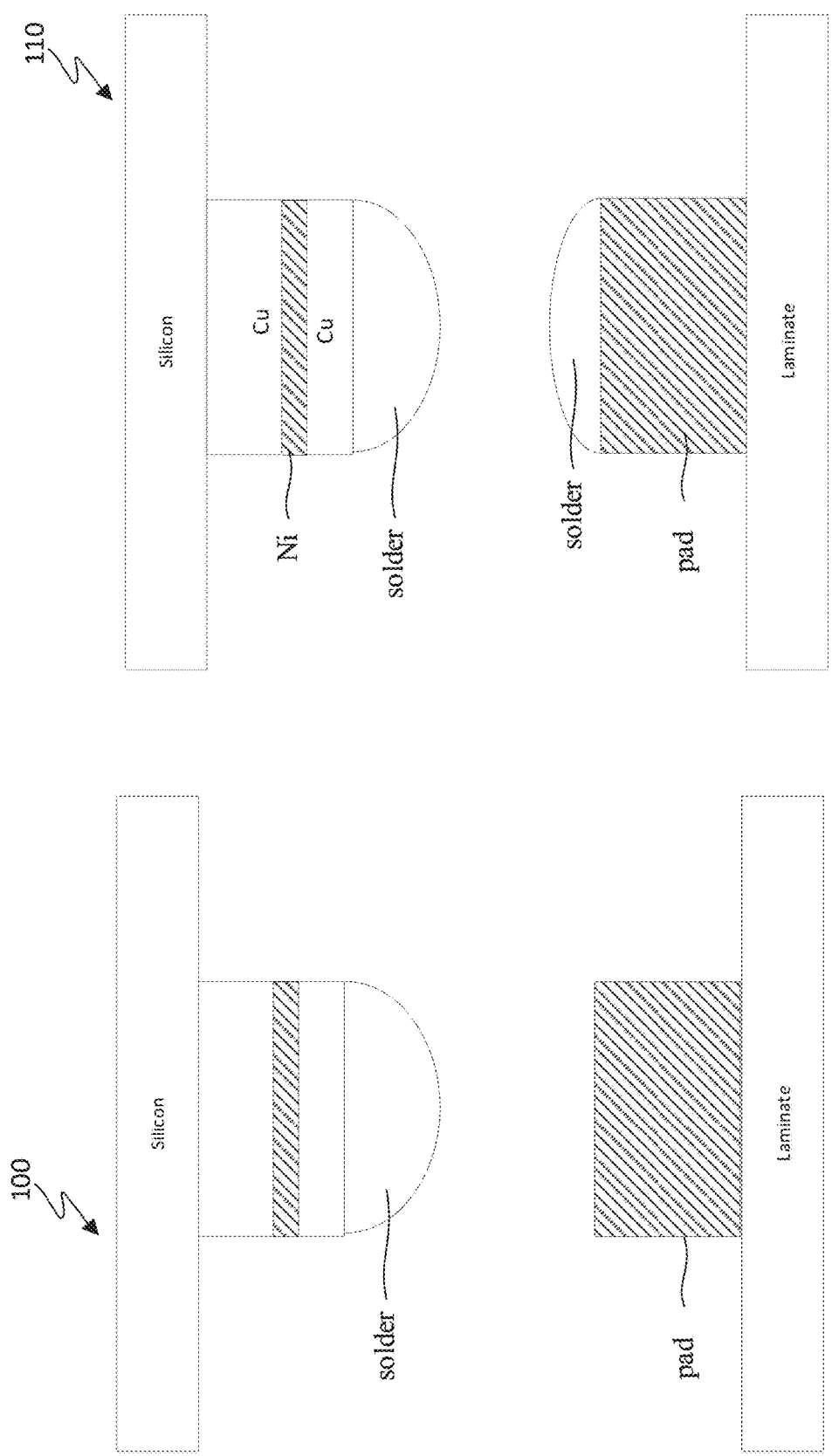
FIG. 1 is a depiction of one of the current state of technology of IC packaging side-by-side with an embodiment of the present invention, designated as 110.

In the current state of art of IC (integrated circuit) packaging (e.g., 2.5D, 3D, etc.), solders used to make electrical connections between the various dies onto a separate laminate layer. 2.5D IC combines multiple IC dies on one package without stacking in a 3D with TSVs (through-silicon vias). The dies are typically place by side on an interposer instead of stacking vertically. Typically, in 2.5D situations, silicon/organic interposers are used as connection between HBM (high bandwidth memory) and other chips. Solders can be used in place of interposers in the above packaging scenario. However, there are challenges with connecting large dies with fine pitch micro-bump structure to the laminate portion since some laminates are not compatible with pre-solder pads and due to the difference in CTE (Coefficient of Thermal Expansion) between silicon and laminate (see FIG. 1). For example, in high-density laminate packaging, pre-solders are not utilized on the laminate side since laminate suppliers do not support such structure.

Other challenges with the current state of art in IC packaging may include, but it is not limited to (i) a need for patterning process with the same diameter and pitch of the solder to be transferred as the pad on the side to be transferred and (ii) a requirement for precise alignment between the pad and the solder to be transferred for the solder transfer process.

Embodiments of the present invention recognizes the deficiencies/challenges in the current state of art and provides an approach for addressing the deficiencies and challenges. One approach leverages transferring of solder powder from a glass or silicon substrate with a unique release layer onto a laminate structure. The approach can be realized during HI (heterogeneous integration)/AI applications as it relates to fine pitch solder interconnects.

Other embodiments of the present invention may recognize one or more of the following facts, potential problems, potential scenarios, and/or potential areas for improvement with respect to the current state of the art: (i) no need to worry about the pith or diameter of the pad side where the solder will be transferred when making the solder to be transferred, (ii) no need for alignment between the substrates when transferring the bumps, (iii) does not require a mask to transfer to a substrate, (iv) does not require a decal wafer, (v) does not require a strip, (vi) no need to prepare solder bumps at a fixed position on the tape, (vii) does not require such a roller, nor does it require a pyramidal recess.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

It should be understood that the Figures are merely schematic and are not drawn to scale. It should also be understood that the same reference numerals are used throughout the Figures to indicate the same or similar parts.

FIG. 1 is a depiction of the current state of technology side-by-side with an embodiment of the present invention. The current approach, designated as 100, is depicted next to an embodiment of the present invention, designated as 110. Essentially in the current approach, the laminate layer containing the pads, does not have any solder material. Thus, joining the dies to a lower laminate structure (without the user of interposers, etc.) is difficult when the amount of solder on the micro-bumps on the silicon side is small, or when the pad height is high, or if the amount of laminate warpage is large. Therefore, an approach of the present invention (i.e., 110) allows for creating solders on the pads so that it can be easily coupled/joined to dies. It is noted that 110 will be explained in greater details through the use of an embodiment (i.e., 210 or 310) in FIG. 2A and FIG. 3A, respectively.

Structural Features

Figure 2A:
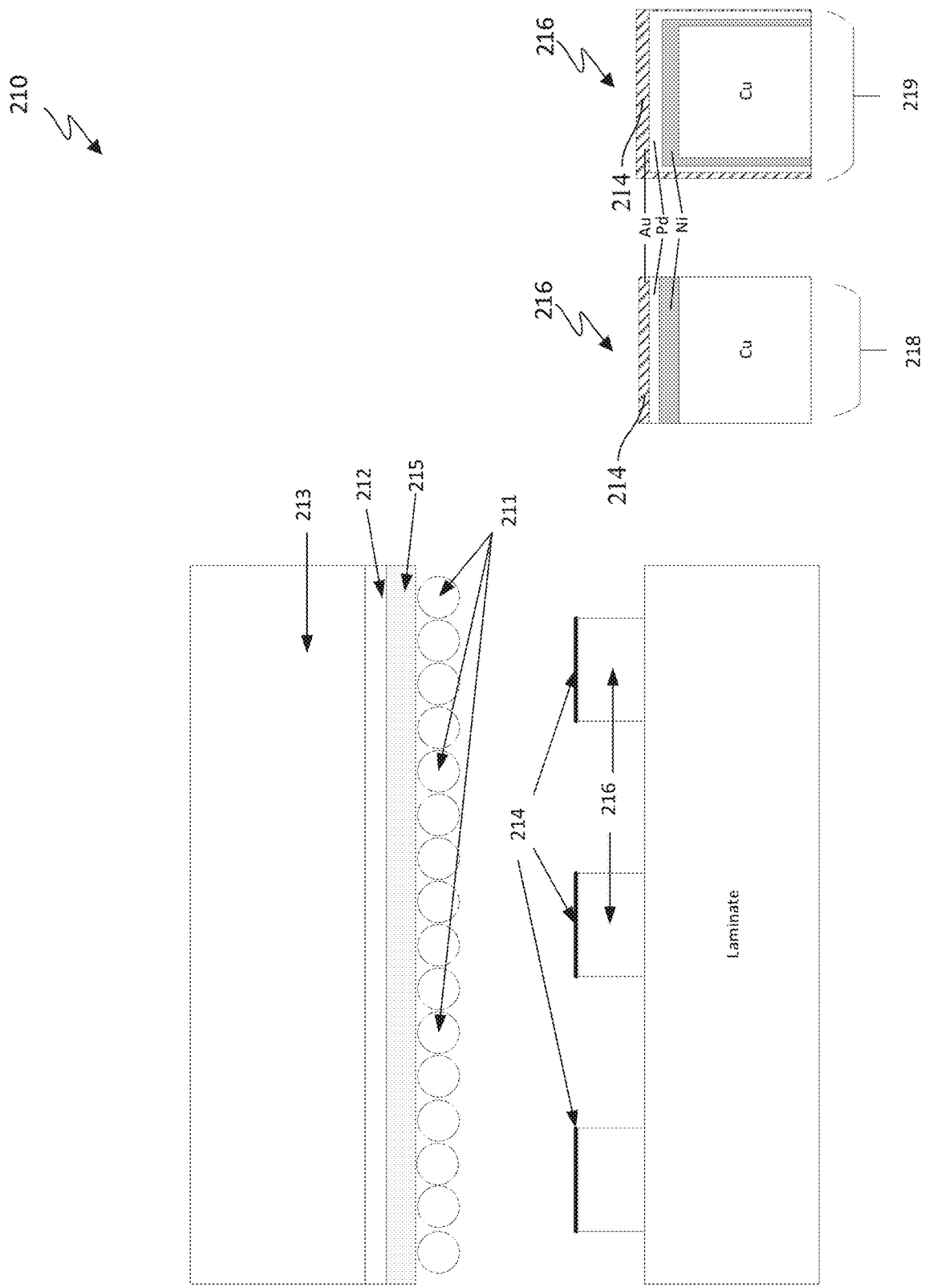
FIG. 2A is a detailed structural depiction of 110, in accordance with one embodiment of the present invention.

FIG. 2A is a detailed structural depiction of 110, in accordance with one embodiment of the present invention.

Solder ball 210, one embodiment of the present invention, is typically made up of the following layers (from top to bottom): (i) glass/silicon substrate (i.e., 213), (ii) release layer (i.e., 212), (iii) adhesive layer (i.e. 215), (iv) solder powder (i.e., 211), (v) pad surface finishing layer (i.e., 214) and (vi) pads 216.

In regard to solder powder 211, this powder is shaped like circular ball (under a fine microscope). The "powder" is adhered to adhesive layer (i.e., 215) or release layer 212 or can be deposited by any known techniques in the art. It is recommended that diameter of solder powder 211 used in the embodiment, be less than 10 μm.

Figure 2B:
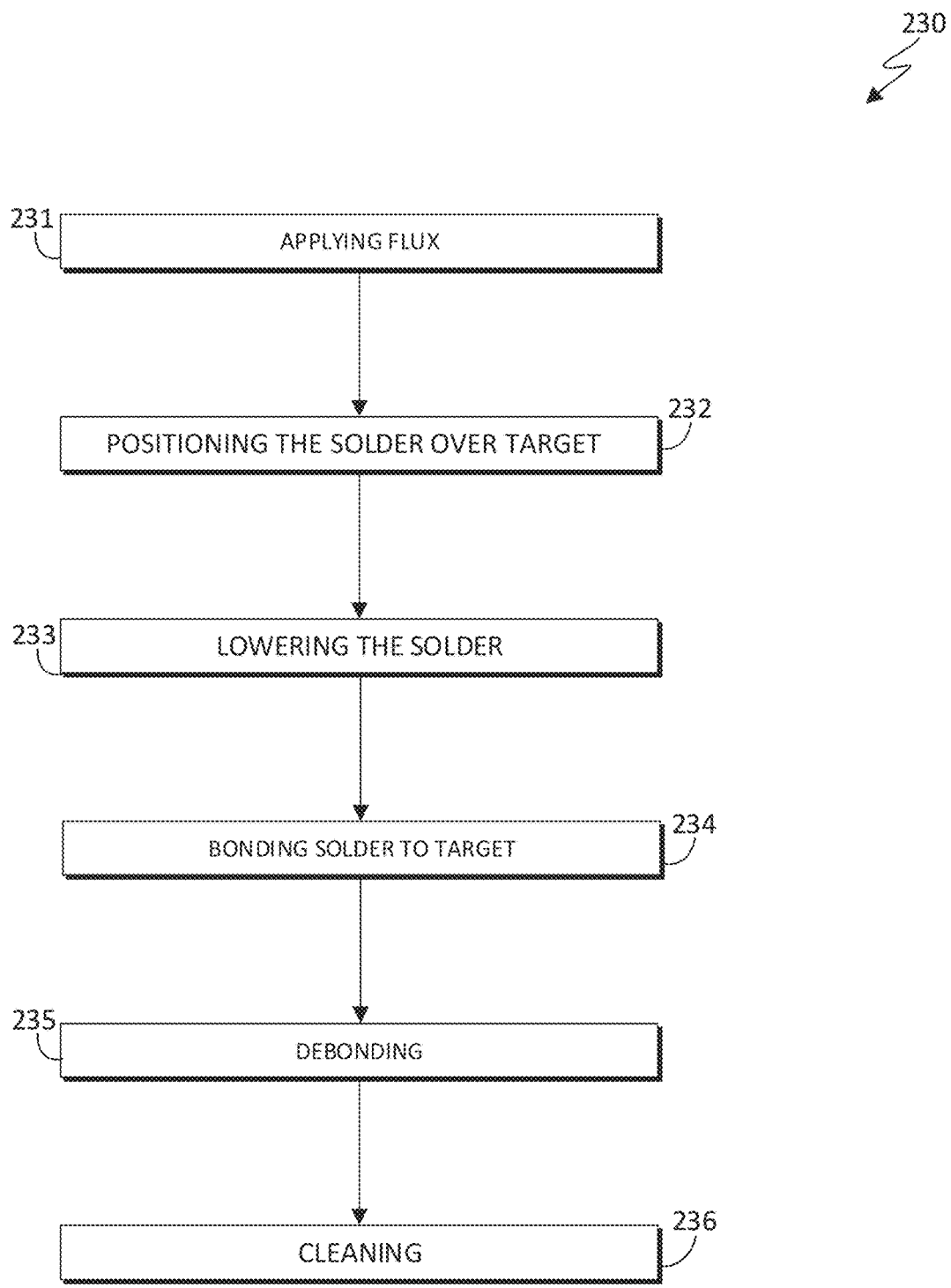
FIG. 2B is a high-level flowchart illustrating how to apply solder ball 210 of 2A, designated as process 230, in accordance with an embodiment of the present invention.
Figure 2C:
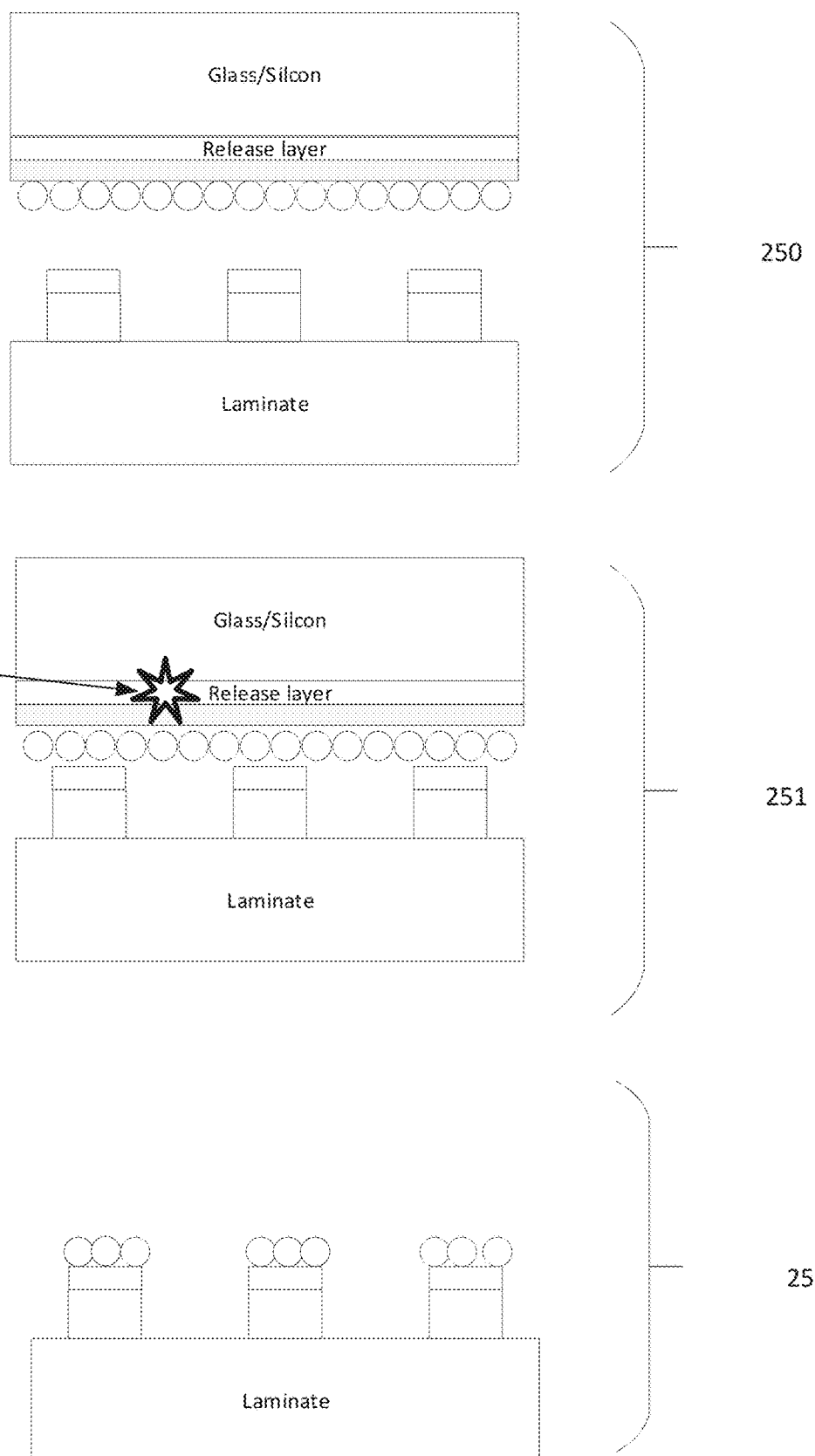
FIG. 2C illustrates, using pictorials, process 230, in accordance with an embodiment of the present invention.
Figure 2D:
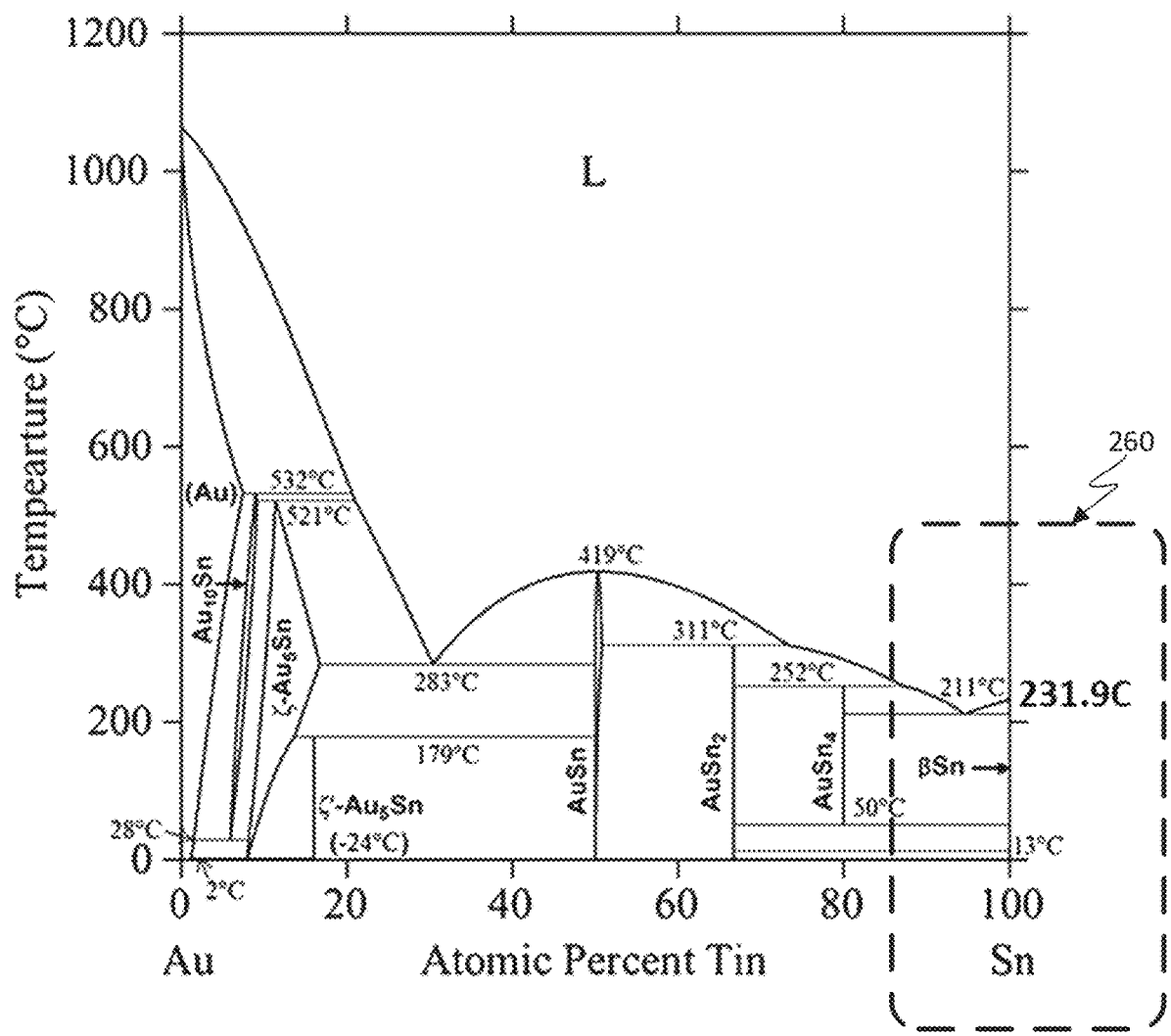
FIG. 2D is Au—Sn phase diagram, illustrating the physics behind the solder transfer process relating to steps of process 230, in accordance with an embodiment of the present invention.

When solder powder 211 comes into contact with the Au (i.e., pad surface finishing layer 214), the Au diffuses into the solder easily and forms a Sn—Au compound, resulting in a 3° C. to 20° C. reduction in the solidus temperature of the solder on the electrode (see 260 of FIG. 2D). An—Su phase diagram of FIG. 2D illustrates the concept of Au diffusion and can be used to predict the phase changes that have occurred in an alloy that has been exposed to a particular heat treatment process. On the other hand, the melting point of the solder powder that is not in contact with the Au electrode does not change, and the solder can be selectively melted only on the electrode surface.

In regard to release layer 212, this is a laser ablation layer (which may include an adhesive function if necessary). It is noted that the term, "release layer" and "laser ablation layer" may be used interchangeably and it is intended to mean the same structure. This layer is formed on a glass or silicon substrate. This layer is used as to "release" the solder powder during and after the laser ablation process. In the case of silicon substrate, release layer 212, typically a UV-absorbing material, is applied or deposited onto the glass by spin coating followed by baking. Regardless of the material used, the release layer may comprise of a material that can be laser ablated at the UV wavelength of choice. The release layer may be generated, for example, by spin coating or spraying the release layer material, for example, onto the substrate, and then curing the material using heat. The laser used for ablating the release layer may be an excimer laser. The laser used for ablating the release layer may be a relatively low power laser compared to an excimer laser.

Laser ablation may be performed by exposing the release layer to UV laser light through the transparent glass substrate. Upon exposure to the UV laser light, the release layer may burn, break down or otherwise decompose. For strongly UV-absorbing or UV-sensitive materials, very thin layers on the order of 100 nm to 300 nm thick may be sufficient to act as release layers. It must also have thermal stability beyond that of the adhesive and be sensitive to the ultraviolet wavelengths (e.g., 355 nm, etc.) of the lasers used in the debonding process. The choice of materials used by the release layer can be dependent on the laser availability at the manufacturing. Typically, the higher the UV absorption (the lower the transmittance), the less laser power is required to ablate the material at a given spot size.

If the substrate of the solder is made of silicon instead of glass, a laser with mid-wavelength infrared radiation can be used to ablate a release layer. The bonding structure is irradiated with infrared energy through the solder substrate to substantially or completely vaporize the release layer such that the laminate substrate is released from the solder substrate as a direct result of the substantial or complete vaporization of the release layer. A wavelength of the infrared energy is in a range of about 1.12 μm to about 5 μm. In the case of silicon solder substrate, the release layer include thin metallic layers and/or adhesive layers formed with metallic particles, which serve as releasable layers that can be substantially or completely ablated (vaporized) using low-power Mid-IR radiation to debond the laminate and solder substrate. It is noted that choice of laser used (e.g., wavelength, intensity/power, etc.) is depended on the material used in the substrate and/or the release layer.

It is noted that if the material used for the laser ablation layer does not have sufficient adhesive performance, then an additional adhesive layer (i.e., adhesive layer 215) maybe required between that laser ablation layer and the solder powder. The laser ablation thickness can be in the range of 0.1 μm to 1 μm. The adhesive layer thickness can have a range of 1 μm to 100 μm. It is further noted that in the Figures, not all embodiments illustrates the use of an adhesive layer since the use is optional and/or dependent on the specific application required by the user.

In regard to substrate 213, this material is a solid, non-flexible and heat-resistant material. In one of the prior art, this layer was typically made from PET (polyester) film. Substrate 213 can be made from materials like glass or silicon since it is rigid and easy to apply a load uniformly (i.e., bonding pressure). In the case of glass substrate, it can be a borosilicate glass and has a thermal expansion coefficient of 3.3 ppm/k which is closely matched to silicon.

Depending on the application requirement where there is a maximum thickness restriction or etc., instead of having another layer for adhesive, the UV-sensitive layer may contain adhesive material.

In regard to pad surface finishing layer 214, it is a thin layer on top of pads of a substrate (i.e., targeted laminate layer for the solder powder to be transferred). This pad surface finishing layer can be made from a metal such as Au (i.e., Gold) which is the preferred and best material for the current embodiment. It is noted that the laminate substrate is already pre-fabricated with pads and a surface finish layer/material (i.e., 214) already deposited on the pads.

In regard to pads 216, this structure can be made of a combination of materials that comprises the following elements, nickel (Ni), palladium (Pd) and copper (Cu). Copper can make up the bulk of pad structure. For example, the pad can contain copper at 15 µm, nickel at 2 µm and palladium at 0.05 µm, with a gold surface at 0.05 µm. In an embodiment (refer to 218 of FIG. 2A), the pad may contain a layer of the following (from bottom to top), (i) copper, (ii) nickel and palladium with gold. In another embodiment (refer to 219 of FIG. 2A), the pad may contain the same layer of the previously mentioned materials, however, with a slightly more coverage. For example, the sidewalls of the entire pad is can be covered with gold as the last finishing layer (see 219 of FIG. 2A).

Other advantages, not previously mentioned, of the above structure combination can include: (i) the substrate can be peeled off by laser irradiation, it can be peeled off under uniform conditions and (ii) a more uniform amount of solder can be left on the target pad, allowing for precise control of the amount of solder.

In another embodiment (referring FIG. 3A), solder powder 211 can be substituted with solder "pillars". This different embodiment of the present invention, designated as solder pillar 310, has the following advantages not covered by solder ball 210. Solder pillar 310 is typically made up of the following layers (from top to bottom): (i) solder pillar (i.e., 314), (ii) release layer (i.e., 313), (iii) glass/silicon substrate (i.e., 312) and pad surface finishing layer (i.e., 315). It is optional to have an adhesive layer 316, similar to pad surface finishing layer 315. For example, if the release layer does not have sufficient adhesion, an adhesive layer may be necessary. If solder is to be deposited by plating, a seed layer is required on the substrate (release layer or adhesive layer).

Release layer 313 has the same characteristics/features as release layer 212 of FIG. 2A. Substrate 312 has the same characteristics/features as substrate 213 of FIG. 2A. Pad surface finishing layer 315 has the same characteristics/features as pad surface finishing layer 214 of FIG. 2A.

Solder pillar 314 is a unique feature, a cylindrical rod like structure made of solder. A variety of shapes are possible for the solder material. For example, rectangular, hexagonal prisms, etc. can be formed from the solder material. The tower shape has an advantage of solder powder (shaped like spheroid) in regard to addressing fine pitch pad application. In a fine pitch pad, the diameter of the solder powder has to be smaller. However, the diameter of the solder powder cannot be too small, where it does not make a good contact with the dies. At the same time, the solder powder cannot be too large where it touches other pads (instead of the targeted pads). Thus, having a tower shape solder material would solve this issue. The diameter of the tower solder should be smaller than the pad, but by changing the height of the tower solder, it is possible to transfer the desired amount (volume) of solder to a fine pitch pads. In the example provided, the thickness (diameter) of the solder tower is in the range of 1 µm to 100 µm. Thus, the volume of solder required on the pads can be accurately achieved through the use of solder pillars by varying the height and/or thickness of the solder pillars.

The aspect ratio of the pillar is an important factor. The aspect ratio is the ratio of the height versus the width (i.e., diameter) of the pillar. It is easy to achieve an aspect ratio of 1:1. However, trying to for form a pattern with a smaller hole diameter and deeper hole, such as 10:1, it is generally difficult to form the hole vertically and it may be slanted. If the resist film thickness is thin, this effect is minimal, but if the resist thickness is thick, this effect is more pronounced. Therefore, depending on the application (size of the pads to be adhered to), the height and/or width of the pillars can be adjusted accordingly. For example, if the large pads with larger pitches, pillars can have a height of 100 µm.

Furthermore, it is possible to create small pillars "cube" which may be similar in dimension to a solder powder ball. These small cube can be used for various applications that may require either coarse or finer pitch pad application. For example, recall the size of solder powder balls.

Figure 3A:
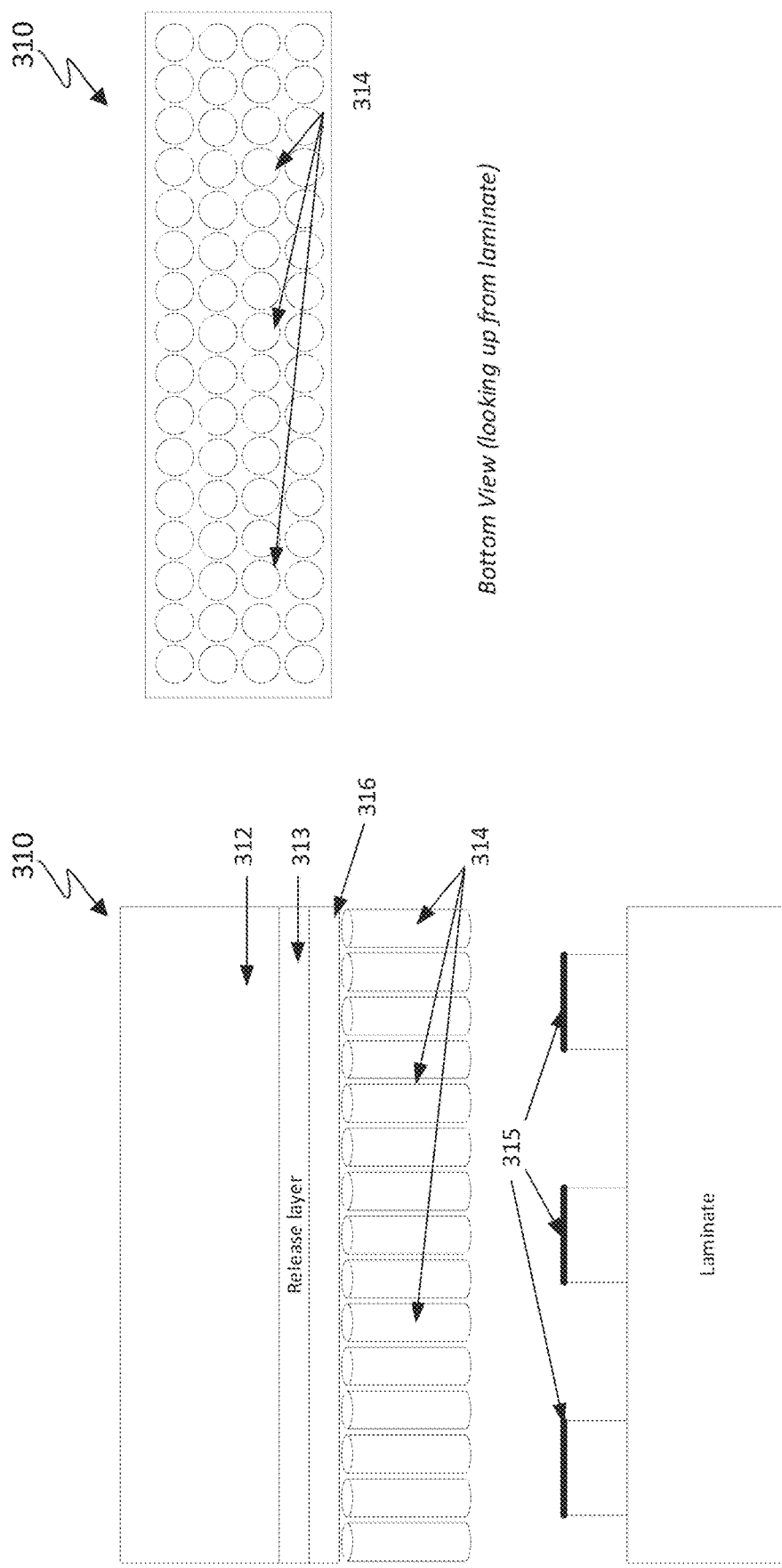
FIG. 3A is a depiction of another embodiment of the present invention, designated as solder pillar 310.
Figure 3B:
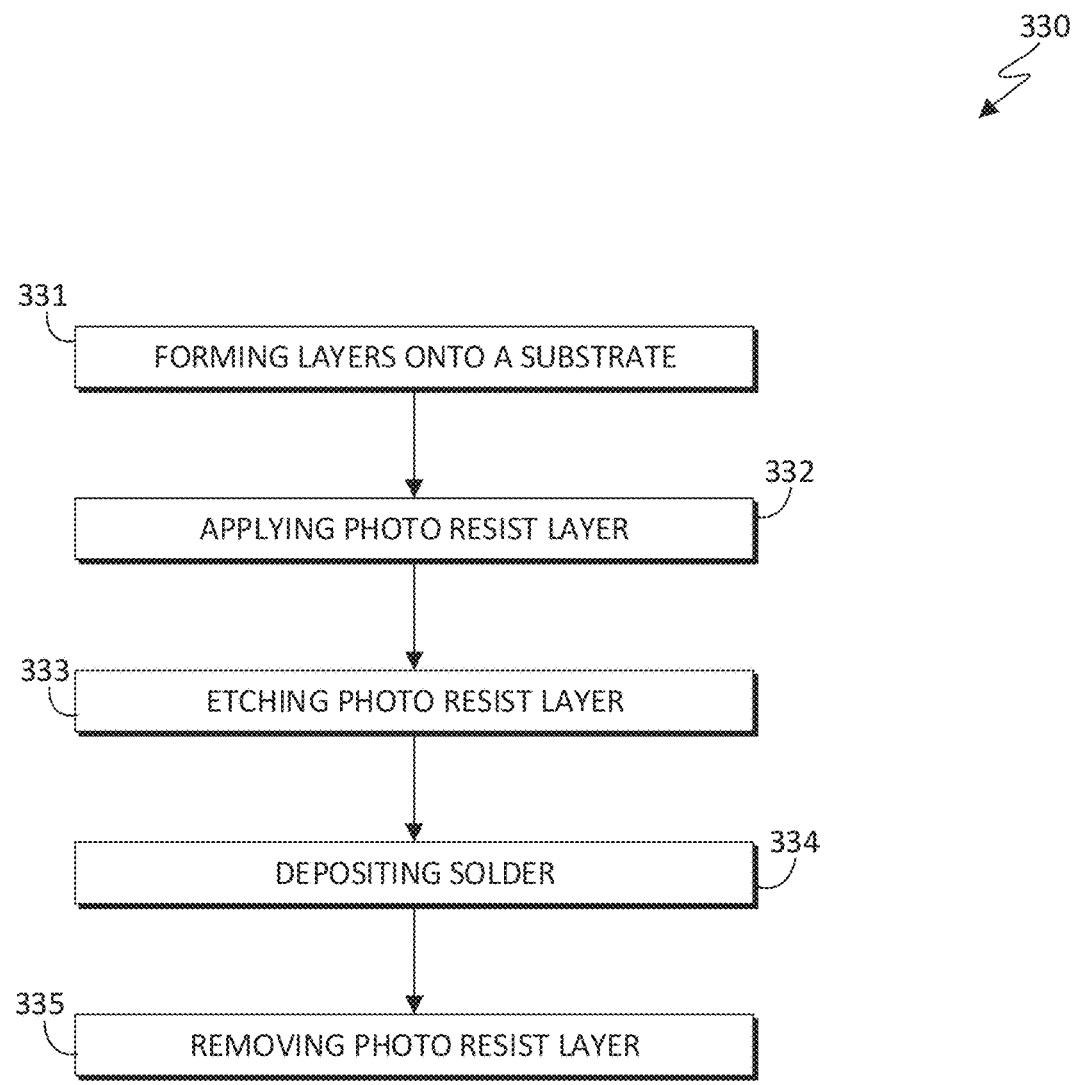
FIG. 3B is a flowchart illustrating a process of forming solder pillar 310, designated as process 230, in accordance with one embodiment of the present invention.
Figure 3C:
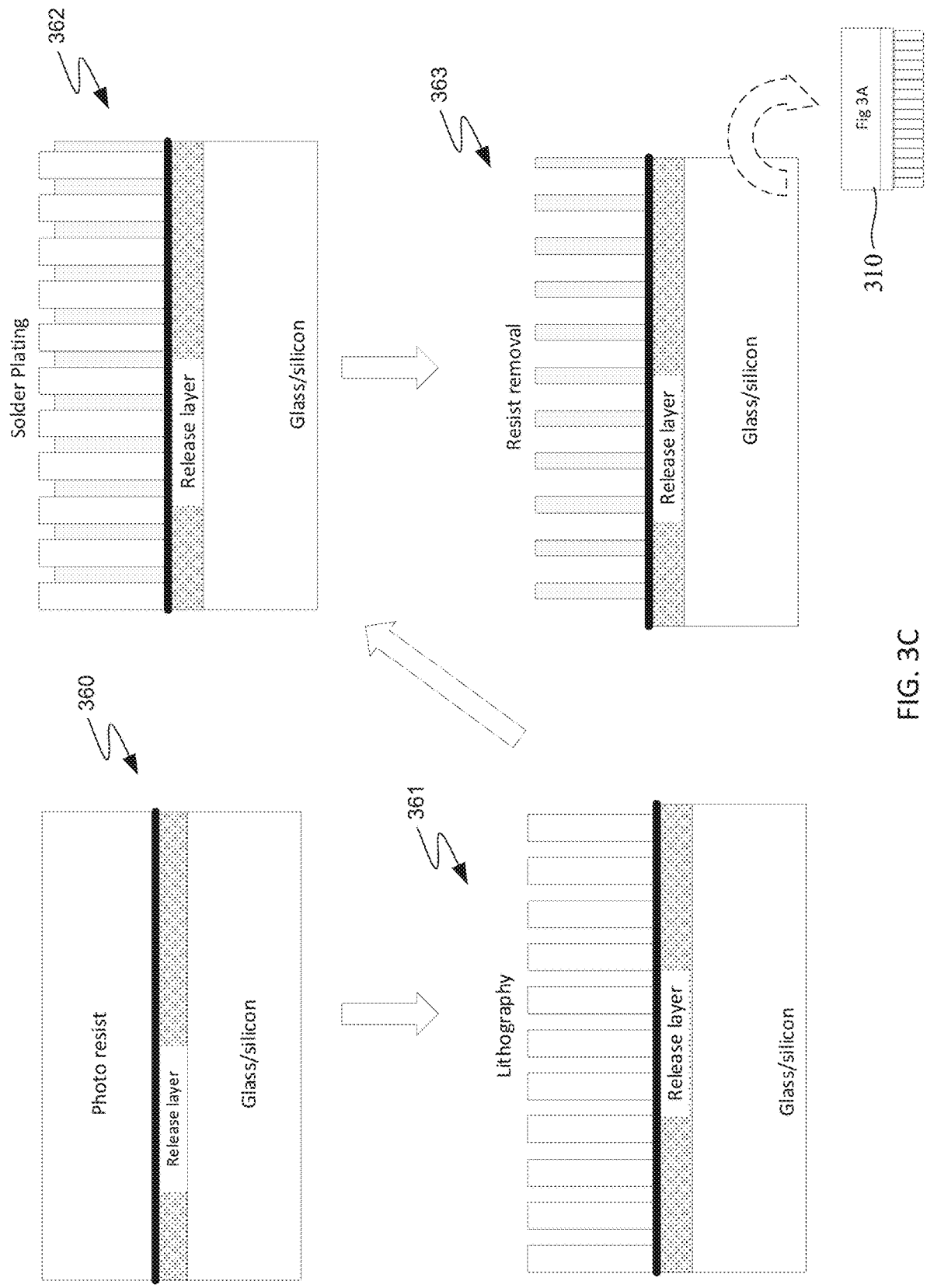
FIG. 3C illustrates the flowchart of 3B, in accordance with an embodiment of the present invention.

FIG. 3B and FIG. 3C illustrate the method of creating a tower pillar.

Process Features

The steps in creating solder ball 210 can be summarized at a high level with the following steps: (i) a laser ablation layer (and an addition adhesive layer, if necessary) is formed on a glass/silicon substrate and (ii) solder powder is deposited onto the layer from step (i). It is noted that if the laser ablation layer used does not have sufficient adhesive performance, then an additional adhesive layer maybe required between that laser ablation layer and the solder powder. The laser ablation thickness can be in the range of 0.1 µm to 1 µm. The adhesive layer thickness can have a range of 1 µm to 100 µm. It is recommended that diameter of solder powder 211 used in the embodiment, be less than 10 µm.

The steps in applying solder ball 210 (or even solder pillar 310) onto a substrate can be summarized at a high level as process 230 (see FIG. 2B). Process begins with at step 231. It can be helpful to follow the steps by referring to in FIG. 2C.

At the beginning (step 231) of the process (i.e., process 230), a flux is applied (step 231). It is noted that flux is a chemical agent that reacts with the oxide film of the solder surface and decomposes oxide layers when heated. This is applied over the solder on the upper substrate, or over the pads on the lower substrate (i.e., laminate), before the bonding process.

Process 230 continues where solder ball 210 is positioned over the targeted laminate (see 250 of FIG. 2C) as step 232. It is noted that the targeted laminate can be made from organic substrate. The next step is to lower solder ball 210 directly onto the laminate (step 233). It is noted that the laminate structure (pre-fabricated) already has pads and that there is already a layer of Au deposited on the pads.

Process 230 continues (step 234) with "bonding" solder ball 210 onto the pad of the substrate. The method to bond solder ball 210 onto the pad is utilizing TCB (thermo compression bonding). TCB can be performed at a temperature slightly (see 251 of FIG. 2C and FIG. 2D) lower than the melting point of the Sn solder (i.e., 5 to 40° C.). It is noted that the purpose of the laser is to peel the glass substrate and not for heating the actual solder. The solder powder in contact with the pad forms a Sn—Au compound due to the Au diffusing from the pad surface, lowering the melting point of the solder. Due to this chemical characteristic, only the solder powder that touches the Au pad is transferred, which means that the solder can be transferred without the need for alignment.

Process 230 continues with debonding (step 235). Debonding means releasing solder ball 210 with a laser. For example, perform a solder substrate debonding process by irradiating the bonding structure through the solder substrate to laser ablate the release layer. Releasing solder ball 210 refers to the removal of the upper silicon (or glass) substrate (i.e., 312) because the ablation layer of the silicon (or glass) substrate (i.e., 312) that originally had solder (powder) on it will peel off when irradiated by the laser. Using a laser (matched to the previous created laser ablation layer) to irradiate the laser ablation layer so that substrate (i.e., 312) with unmelted solder powder can be easily removed off from the laminate structure.

Figure 2E:
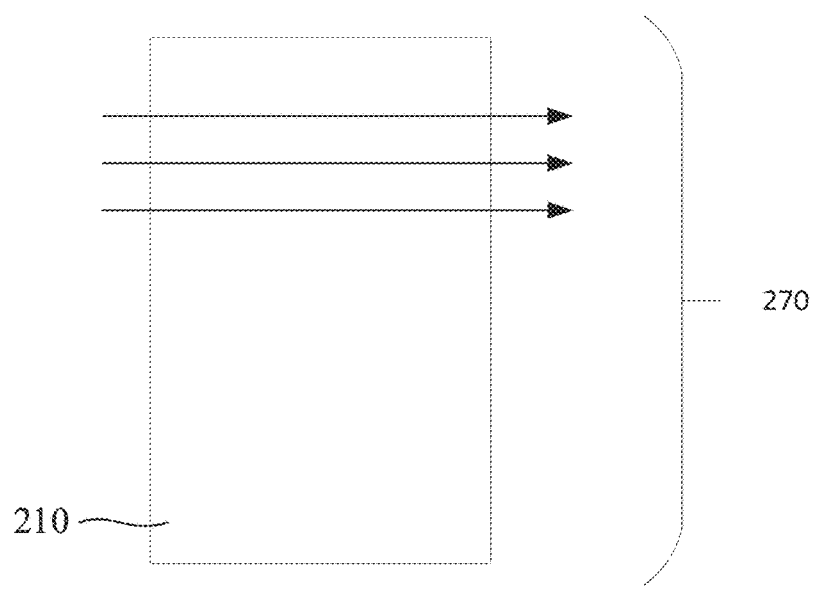
FIG. 2E illustrates possible patterns for the beam of a laser to follow on the release layering, in accordance with an embodiment of the present invention.
Figure 2E:
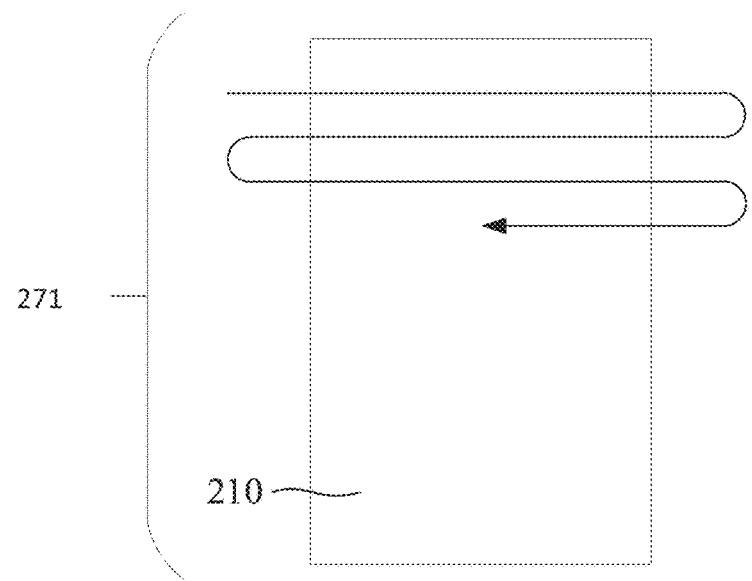

The use of the laser (irradiated from above the substrate) can follow a few patterns as illustrated in 2E. In FIG. 2E, the laser light may be directed across the top surface of the solder ball 210 as a spot beam drawn to lines (see 270) which move along an x-axis direction of the solder ball 210 with each successive line 32 being drawn lower in the y-axis direction. Alternatively, as seen in 271, the laser light may be directed in a serpentine pattern. It is noted that this pattern of the laser can be used on solder pillar 310 as well. If the substrates is made from glass, then the laser used can have a wavelength of approximately 350 to 360 nm. However, if the substrate is made from silicon, the wavelength of the infrared energy is in the range of 1.12 μm to about 5 μm.

Step 235 continues with residue cleaning of flux, adhesive, ablation layer, etc. and ashing/$O_2$ RIE (reactive ion etching) (step 236). It is noted at the $O_2$ RIE maybe an optional step. However, cleaning is a required step. As an option, it is also possible to reflow the transferred solder to shape it. In order to perform the reflow the flux can be applied and reflowing the substrate by using furnace reflow. It can be done in an oven-type or belt-type reflow furnace. Steps 234-236 can be referred to 252 of FIG. 2C.

The steps in creating solder pillar 310 can be summarized with a high level process, designated as process 330. It can be helpful to follow the steps by referring to in FIG. 3C.

Process 330 begins (step 331) with a substrate (e.g., glass or silicon or both) with forming a release and seed layer to cover the substrate (refer to 360 of FIG. 3C). It is noted that this illustrates an inverted position of how silicon pillar 310 of FIG. 3A is depicted.

Additionally, a photo resist layer is applied over the aforementioned layers (i.e., release and seed layers) (step 332). The next step (step 333) involves etching the photo resist layer. Etching can leverage the use of lithography to remove unwanted materials in order create empty cylinder tower-like structures (refer to 361 of FIG. 3C). Process 330 continues (step 334) with depositing a solder (by plating) into the empty cylinder structures from the previous step (refer to 362 of FIG. 3C). The final step (335) is removing the photo resist layer and exposing only the solder tower (refer to 363 of FIG. 3C).

Alternatively to step 334, it is also possible to use the IMS (injection molded solder) method to create a structure (instead of plating), as depicted by 362 of FIG. 3C. The solder can be formed by injecting a molten solder into the resist opening after patterning. Thus, no seed layer is required on the substrate because the method is different from plating.

Figure 4:
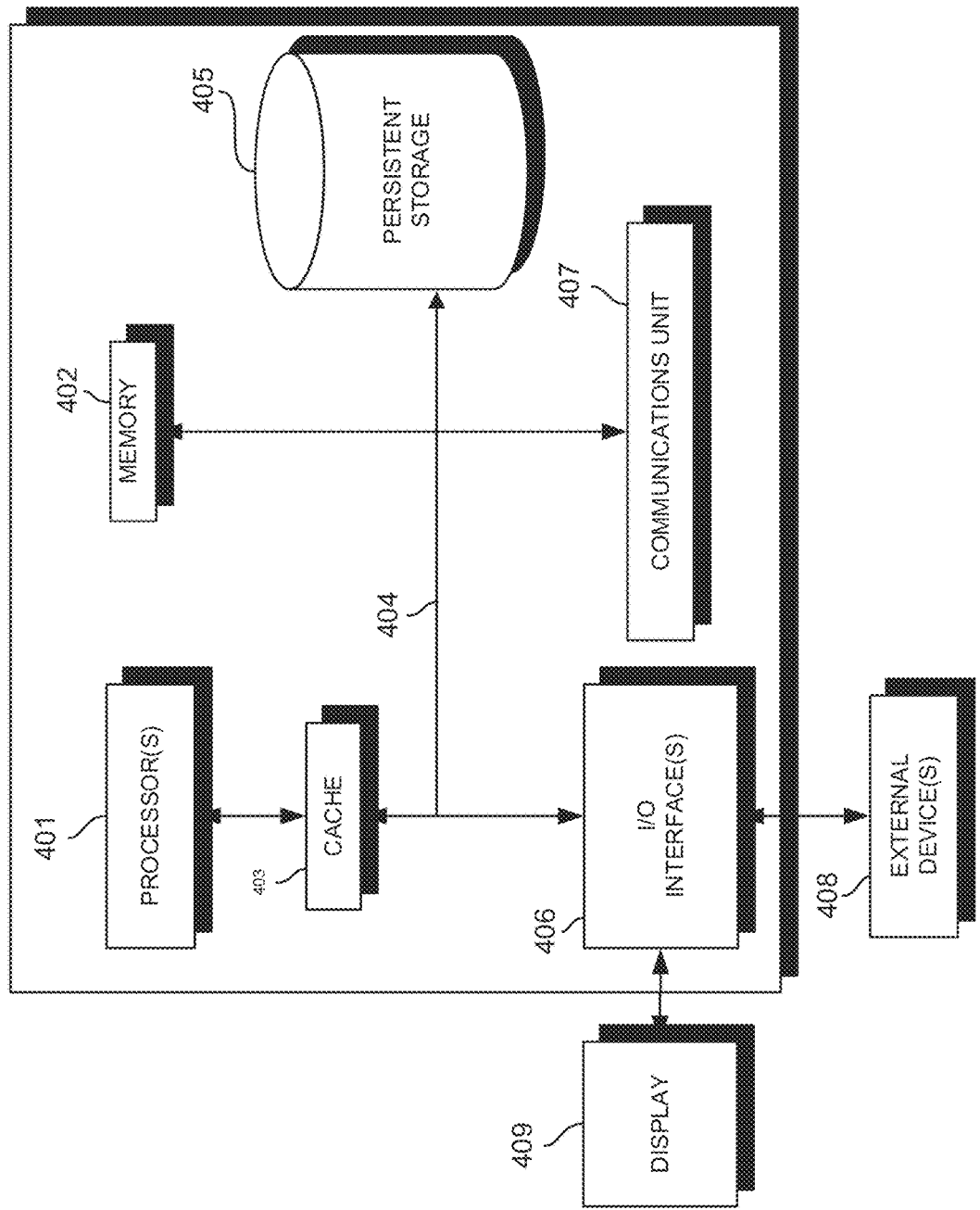
FIG. 4 depicts a block diagram, designated as 400, of components of a server computer capable of executing process 230 and process 330, in accordance with an embodiment of the present invention.

FIG. 4, designated as 400, depicts a block diagram of components of a computer system executing process 230 and/or process 330, in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

FIG. 4 includes processor(s) 401, cache 403, memory 402, persistent storage 405, communications unit 407, input/output (I/O) interface(s) 406, and communications fabric 404. Communications fabric 404 provides communications between cache 403, memory 402, persistent storage 405, communications unit 407, and input/output (I/O) interface(s) 406. Communications fabric 404 can be implemented with any architecture designed for passing data and/or control information between processors (such as microprocessors, communications and network processors, etc.), system memory, peripheral devices, and any other hardware components within a system. For example, communications fabric 404 can be implemented with one or more buses or a crossbar switch.

Memory 402 and persistent storage 405 are computer readable storage media. In this embodiment, memory 402 includes random access memory (RAM). In general, memory 402 can include any suitable volatile or non-volatile computer readable storage media. Cache 403 is a fast memory that enhances the performance of processor(s) 401 by holding recently accessed data, and data near recently accessed data, from memory 402.

Program instructions and data (e.g., software and data x10) used to practice embodiments of the present invention may be stored in persistent storage 405 and in memory 402 for execution by one or more of the respective processor(s) 401 via cache 403. In an embodiment, persistent storage 405 includes a magnetic hard disk drive. Alternatively, or in addition to a magnetic hard disk drive, persistent storage 405 can include a solid state hard drive, a semiconductor storage device, a read-only memory (ROM), an erasable programmable read-only memory (EPROM), a flash memory, or any other computer readable storage media that is capable of storing program instructions or digital information.

The media used by persistent storage 405 may also be removable. For example, a removable hard drive may be used for persistent storage 405. Other examples include optical and magnetic disks, thumb drives, and smart cards that are inserted into a drive for transfer onto another computer readable storage medium that is also part of persistent storage 405. Process 230 and/or process 330 can be stored in persistent storage 405 for access and/or execution by one or more of the respective processor(s) 401 via cache 403.

Communications unit 407, in these examples, provides for communications with other data processing systems or devices. In these examples, communications unit 407 includes one or more network interface cards. Communications unit 407 may provide communications through the use of either or both physical and wireless communications links. Program instructions and data (e.g., process 230 and/or process 330) used to practice embodiments of the present invention may be downloaded to persistent storage 405 through communications unit 407.

I/O interface(s) 406 allows for input and output of data with other devices that may be connected to each computer system. For example, I/O interface(s) 406 may provide a connection to external device(s) 408, such as a keyboard, a keypad, a touch screen, and/or some other suitable input device. External device(s) 408 can also include portable computer readable storage media, such as, for example, thumb drives, portable optical or magnetic disks, and memory cards. Program instructions and data (e.g., process 230 and/or process 330) used to practice embodiments of the present invention can be stored on such portable computer readable storage media and can be loaded onto persistent storage 405 via I/O interface(s) 406. I/O interface(s) 406 also connect to display 409.

Display 409 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of transferring solder onto a laminate, the method comprising:
   applying a first flux;
   positioning solder structure over target, wherein the solder structure comprises:
      a substrate;
      a laser ablation layer;
      an adhesive layer; and
      a solder layer made with solder;
   lowering the solder structure towards the target, wherein the target comprises:
      a laminate substrate;
      one or more pads located on the laminate substrate; and
      one or more pad surface finishing layers located on a top surface of the one or more pads;
   bonding solder of the solder structure to the target;
   debonding the solder structure; and
   cleaning residue of the first flux, the adhesive layer, and the laser ablation layer.

2. The method of claim 1, wherein:
   the target comprises of one or more pads located on a laminate layer and one or more pad surface finishing layers located on the one or more pads.

3. The method of claim 1, wherein:
   the one or more pad surface finishing layers comprises of a material made of gold.

4. The method of claim 1, wherein applying the first flux further comprises:
   depositing the first flux onto the solder layer or the one or more pad surface finishing layers.

5. The method of claim 1, wherein bonding solder of the solder structure to target further comprises:
   adhering, using TCB (thermo compression bonding), the solder layer to the one or more pad surface finishing layers, wherein temperature used by TCB is lower than a melting point of the solder layer.

6. The method of claim 1, wherein debonding the solder structure further comprises:
   removing the substrate made of glass from the target by ablating the laser ablation layer with a laser, wherein the laser has a wavelength of between 350 nm to 360 nm.

7. The method of claim 1, wherein debonding the solder structure further comprises:
   removing the substrate made of silicon from the target by ablating the laser ablation layer with a laser, wherein the laser has a wavelength of the infrared energy is in a range of 1.12 µm to 5 µm.

8. The method of claim 1, further comprising:
   applying a second flux and reflowing.

* * * * *